United States Patent
Lin

(10) Patent No.: US 8,648,626 B2
(45) Date of Patent: Feb. 11, 2014

(54) CLOCK GENERATORS, CLOCK GENERATING METHODS, AND MOBILE COMMUNICATION DEVICE USING THE CLOCK GENERATOR

(75) Inventor: Yu-Hong Lin, Xindian (TW)

(73) Assignee: Via Telecom Co., Ltd., George Town, Grand Cayman (KY)

( * ) Notice: Subject to any disclaimer, the term of this patent is extended or adjusted under 35 U.S.C. 154(b) by 214 days.

(21) Appl. No.: 12/906,407

(22) Filed: Oct. 18, 2010

(65) Prior Publication Data
US 2011/0248785 A1   Oct. 13, 2011

(30) Foreign Application Priority Data
Apr. 8, 2010   (TW) ................. 99110892 A

(51) Int. Cl.
*H03B 21/00* (2006.01)

(52) U.S. Cl.
USPC ........... 327/105; 327/106; 327/150; 327/159; 331/1 A; 331/1 R; 331/34; 331/177 R; 375/376

(58) Field of Classification Search
USPC .......... 327/150, 159, 291, 105, 106; 331/1 A, 331/1 R, 34, 177 R; 375/376
See application file for complete search history.

(56) References Cited

U.S. PATENT DOCUMENTS

| | | | | |
|---|---|---|---|---|
| 5,038,117 A * | 8/1991 | Miller | | 331/16 |
| 5,448,191 A * | 9/1995 | Meyer | | 327/105 |
| 5,742,191 A * | 4/1998 | Romesburg et al. | | 327/156 |
| 6,366,174 B1 * | 4/2002 | Berry et al. | | 331/78 |
| 6,566,964 B1 * | 5/2003 | Hirano | | 331/1 A |
| 6,829,318 B2 * | 12/2004 | Kawahara | | 375/376 |
| 7,518,455 B2 * | 4/2009 | Wang | | 331/16 |
| 7,884,674 B2 * | 2/2011 | Chen et al. | | 331/1 A |
| 2004/0095863 A1 * | 5/2004 | Verboom et al. | | 369/47.28 |
| 2007/0262822 A1 * | 11/2007 | Mitric et al. | | 331/16 |
| 2008/0191778 A1 * | 8/2008 | Huang et al. | | 327/336 |
| 2009/0184773 A1 * | 7/2009 | Woo et al. | | 331/1 R |
| 2010/0188158 A1 * | 7/2010 | Ainspan et al. | | 331/1 A |

* cited by examiner

*Primary Examiner* — Arnold Kinkead
*Assistant Examiner* — Richard Tan
(74) *Attorney, Agent, or Firm* — McClure, Qualey & Rodack, LLP

(57) ABSTRACT

A clock generator and generating method, and a mobile communication device using the clock generator. A clock generator comprises a first accumulator, an oscillating signal generating circuit and a frequency adjustment circuit. The oscillating signal generating circuit generates a first oscillating signal and adjusts a frequency of the first oscillating signal according to a first overflow output signal of the first accumulator. The frequency adjustment circuit generates a frequency control value according to the first oscillating signal and a reference oscillating signal. The first accumulator accumulates the frequency control value according to the first oscillating signal to generate the first overflow output signal.

15 Claims, 8 Drawing Sheets

CLOCK GENERATORS, CLOCK GENERATING METHODS, AND MOBILE COMMUNICATION DEVICE USING THE CLOCK GENERATOR

CROSS REFERENCE TO RELATED APPLICATIONS

This application claims priority of Taiwan Patent Application No. 99110892, filed on Apr. 8, 2010, the entirety of which is incorporated by reference herein.

BACKGROUND OF THE INVENTION

1. Field of the Invention

The invention relates to a clock generator, and more particularly to a clock generator utilized in a power saving mode of a mobile communication device.

2. Description of the Related Art

A clock signal utilized in mobile communication applications has to be very precise so as to provide a stable clock signal for establishing the communications. A crystal oscillator is one common clock generator.

A mobile communication device generally requires at least two clock signals with different oscillating frequencies, where one is used for establishing communications and the other one is used for keeping accurate time of the mobile communications device. Take a Code Division Multiple Access (CDMA) communication system as an example, system frequency for establishing communication is about 19.2 MHz, while frequency of a real time clock for keeping accurate time is only about 32.768 KHz, which is much lower than 19.2 MHz. Therefore, at least two crystal oscillators are generally required by a mobile communication device, wherein one is utilized to provide a high frequency oscillating signal to establish communication channels, and the other one is utilized to provide a low frequency oscillating signal as the real time clock.

However, increased power consumption is required to support operations of two crystal oscillators. Even when the mobile communication device is in a power saving mode, such as a deep sleep mode or a real time clock (RTC) mode, the crystal oscillator providing the low frequency oscillating signal must still remain operational so that after the mobile communication device wakes up and returns to a normal mode, accurate timing thereof can be recovered. Thus, the non-stop low frequency crystal oscillator keeps consuming battery power throughout its operation, which shortens the standby time of the mobile communication device.

In addition, the cost of a crystal oscillator is very expensive. Therefore, a clock device that is capable of providing accurate timing for a mobile communications device while also saving power and reducing manufacturing costs is highly required.

BRIEF SUMMARY OF THE INVENTION

A clock generator, a mobile communication device, and a clock generating method are provided. An exemplary embodiment of a clock generator comprises a first accumulator, an oscillating signal generating circuit and a frequency adjustment circuit. The first accumulator comprises a first input terminal, a second input terminal, a first control terminal, a first sum output terminal and a first overflow output terminal. The second input terminal is coupled to the first sum output terminal. The oscillating signal generating circuit generates a first oscillating signal and adjusts a frequency of the first oscillating signal according to a first overflow output signal of the first overflow output terminal of the first accumulator. The frequency adjustment circuit generates a frequency control value according to the first oscillating signal and a reference oscillating signal. The frequency control value is received at the first input terminal of the first accumulator, and the first oscillating signal is received at the first control terminal so that the first accumulator accordingly accumulates the frequency control value to generate the first overflow output signal.

Another exemplary embodiment of a mobile communications device comprises a crystal oscillator, a clock generator and a reference oscillating signal generator. The crystal oscillator provides a high frequency oscillating signal. The clock generator provides a low frequency oscillating signal and comprises a first accumulator, an oscillating signal generating circuit and a frequency adjustment circuit. The first accumulator comprises a first input terminal, a second input terminal, a first control terminal, a first sum output terminal and a first overflow output terminal. The second input terminal is coupled to the first sum output terminal. The oscillating signal generating circuit generates the low frequency oscillating signal and adjusts a frequency of the low frequency oscillating signal according to a first overflow output signal of the first overflow output terminal of the first accumulator. The frequency adjustment circuit generates a frequency control value according to the low frequency oscillating signal and a reference oscillating signal. The frequency control value is received at the first input terminal of the first accumulator, and the low frequency oscillating signal is received at the first control terminal so that the first accumulator accordingly accumulates the frequency control value to generate the first overflow output signal. The reference oscillating signal generator generates the reference oscillating signal according to the high frequency oscillating signal provided by the crystal oscillator.

Another exemplary embodiment of a clock generating method comprises: generating a first oscillating signal by an oscillating signal generator; generating a frequency control value according to the first oscillating signal and a reference oscillating signal; accumulating the frequency control value according to the first oscillating signal to generate a first overflow indicator; and adjusting a frequency of the first oscillating signal according to the first overflow indicator.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Different from using a crystal oscillator to generate an oscillating signal in the conventional technique, a clock generator, which generates the oscillating signal by using an oscillating device, such as a current/capacitor oscillator (I/C oscillator) or other oscillators (which can further be implemented as a circuit inside of a chip) different from the crystal oscillator, is proposed. By modifying the non-crystal oscillating device, which is hereinafter called an oscillating signal generating circuit, a tunable oscillating frequency of an output signal is provided.

Figure 1:
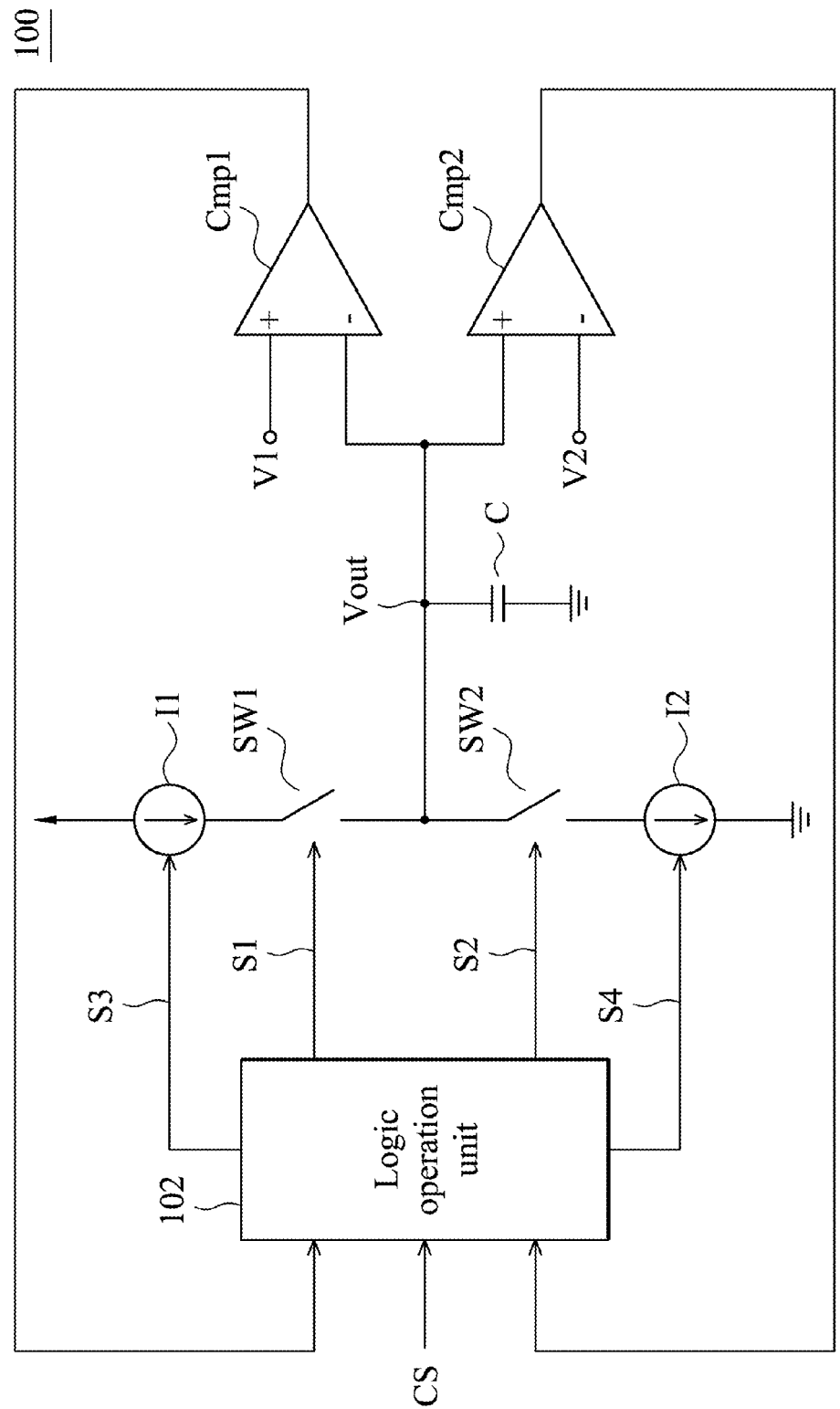
FIG. 1 shows an oscillating signal generating circuit according to an embodiment of the invention.

FIG. 1 shows an oscillating signal generating circuit according to an embodiment of the invention, wherein a current/capacitor oscillator is utilized to oscillate the output signal Vout. The oscillating signal generating circuit 100 comprises current sources I1 and I2, switches SW1 and SW2, a capacitor C, comparators Cmp1 and Cmp2 and a logic operation unit 102. The output signal Vout is output to the input terminals of the comparators Cmp1 and Cmp2, and respectively compared with two different reference signals V1 and V2. The logic operation unit 102 generates signals S1 and S2 according to the output of the comparators Cmp1 and Cmp2 to respectively control the on/off statuses of the switches SW1 and SW2, and control charging or discharging of the capacitor C via the current source I1 or the current source I2, respectively. Therefore, voltage of the output signal Vout oscillates. For example, the reference voltages V1 and V2 may be respectively set as an upper bound and a lower bound of the oscillation of the output signal Vout. The logic operation unit 102 controls the voltage of the output signal Vout to oscillate between the upper bound V1 and the lower bound V2.

Because of environmental factors, such as temperature or process variations, an output signal Vout may not be able to oscillate at an ideal frequency. Thus, the proposed oscillating signal generating circuit 100 further provides a frequency adjustment function to mitigate this problem. As shown in the figure, the oscillating signal generating circuit 100 may further determine the oscillating frequency of the output signal Vout according to a control signal CS. The logic operation unit 102 generates signals S3 and S4 according to the control signal CS so as to adjust the current provided by the current sources I1 and I2, respectively and further change the charge/discharge speed of the capacitor C to control the oscillating frequency of the output signal Vout. For example, the control signal CS may represent one bit information. When the value of the control signal CS is a logic 1, the signals S3 and S4 provided by the logic operation unit 102 may control the current sources I1 and I2 to increase the provided current so as to increase the oscillating frequency of the output signal Vout. When the value of the control signal CS is a logic 0, the signals S3 and S4 provided by the logic operation unit 102 may control the current sources I1 and I2 to decrease the provided current so as to reduce the oscillating frequency of the output signal Vout (Note that the inverse logic rule may also be implemented in other embodiments). In an embodiment of the invention, suppose that (without considering the value of the control signal CS) the oscillating signal generating circuit 100 is originally designed to generate the output signal with an oscillating frequency fo, then when the value of the control signal CS is a logic 1, the oscillating frequency of the output signal Vout may be at most increased up to 1.5*fo, and when the value of the control signal CS is a logic 0, the oscillating frequency of the output signal Vout may be at most reduced to 0.5*fo.

Figure 2:
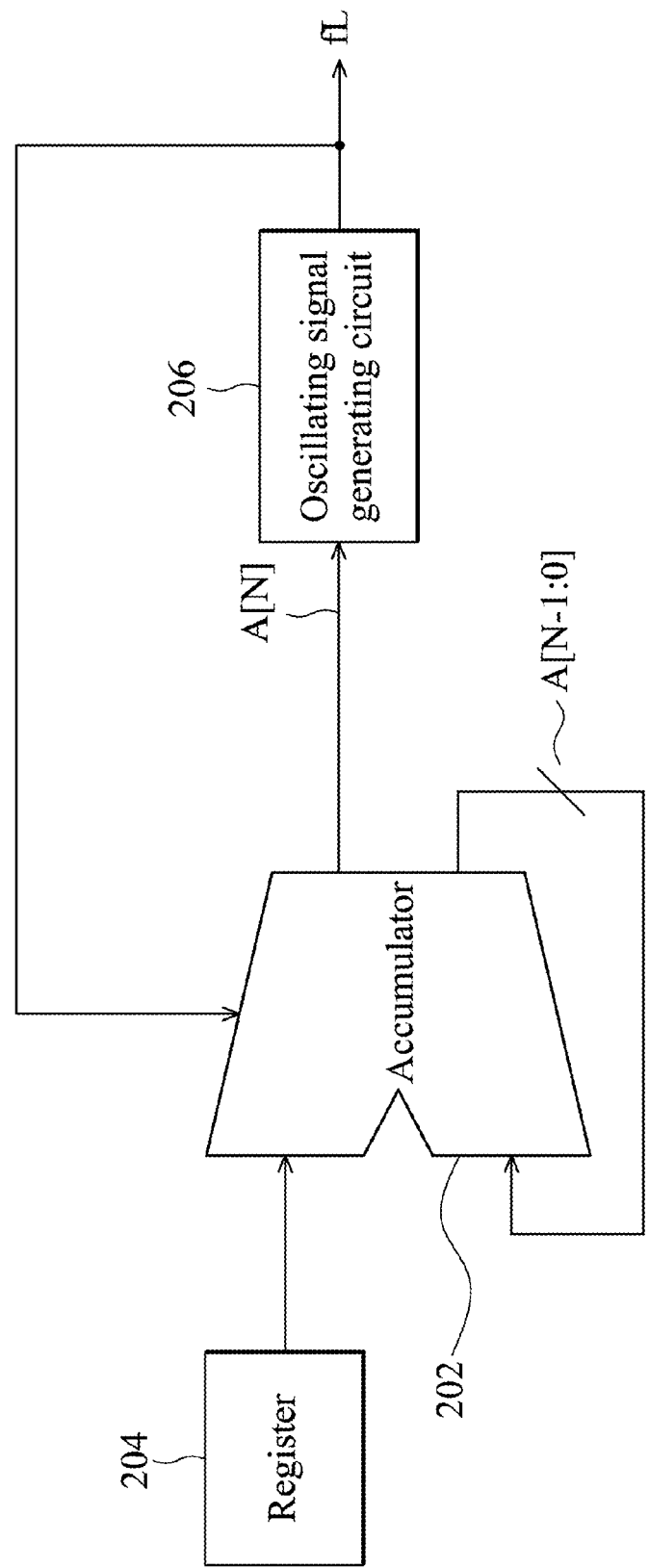
FIG. 2 shows a clock generator according to an embodiment of the invention.

FIG. 2 shows a clock generator according to an embodiment of the invention. The clock generator 200 comprises an accumulator 202, a register 204 and an oscillating signal generating circuit 206 without a crystal oscillator configured therein (which may be the oscillating signal generating circuit 100 shown in FIG. 1) for generating a low frequency oscillating signal fL as the real time clock of an electronic device. In the embodiment shown in FIG. 2, input signal A[n] and output low frequency oscillating signal fL of the oscillating signal generating circuit 206 may correspond to the control signal CS and the output signal Vout of the oscillating signal generating circuit 100 shown in FIG. 1. The accumulator 202 provides N bits operation, where A[N−1:0] is the accumulation result and A[N] is the overflow output. The register 204 provides a frequency control value for the accumulator 202 to perform accumulation operations. The accumulator 202 receives the low frequency oscillating signal fL as the control clock, repeatedly accumulates the frequency control value, and provides the generated overflow output A[N] to the oscillating signal generating circuit 206 so as to adjust a frequency of the low frequency oscillating signal fL.

As shown in the structure in FIG. 2, the frequency control value registered in the register 204 may be utilized to determine the overall oscillating frequency (i.e. the average oscillating frequency over a long period of time) of the low frequency oscillating signal fL.

Figure 3:
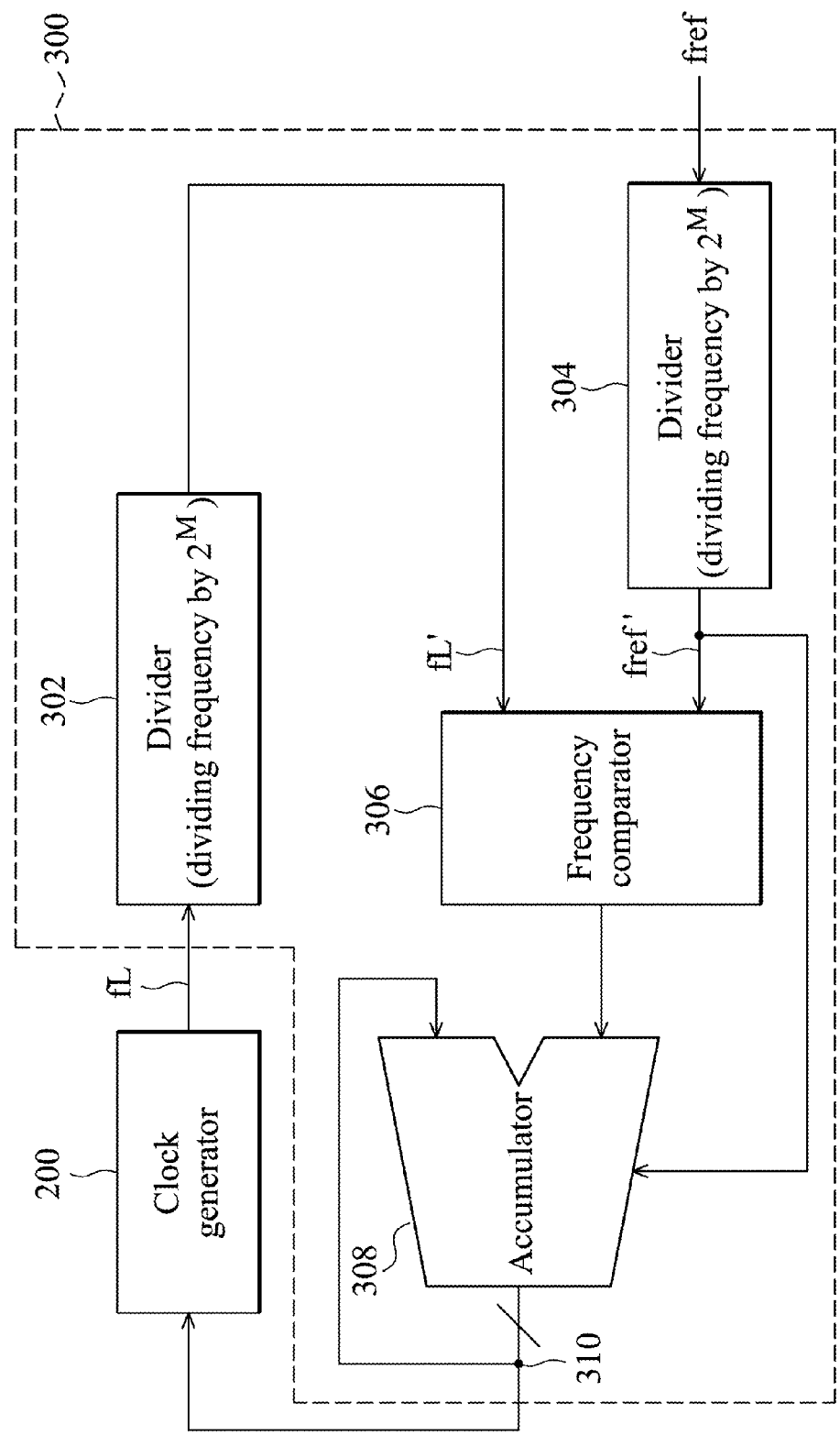
FIG. 3 shows a frequency adjustment circuit according to an embodiment of the invention.

In order to set the above-mentioned frequency control value, a frequency adjustment circuit is further provided. The frequency adjustment circuit retrieves an optimum frequency control value according to the low frequency oscillating signal fL and a reference oscillating signal fref, and stores the optimum frequency control value in the register 204. FIG. 3 shows a frequency adjustment circuit according to an embodiment of the invention. The frequency adjustment circuit 300 comprises two dividers 302 and 304, a frequency comparator 306 and an accumulator 308. The dividers 302 and 304 are utilized to make sure that operations of the frequency adjustment circuit 300 converge. The divisors of the dividers 302 and 304 relate to the bit number (N) of the accumulator 202 of the clock generator 200. For example, the dividers 302 and 304 may respectively divide a frequency of the low frequency oscillating signal fL and a frequency of the reference oscillating signal fref by $2^M$ (where M is an integer larger than N) to obtain a divided low frequency oscillating signal fL' and a divided reference oscillating signal fref'. Therefore, the frequency adjustment circuit 300 may adjust the frequency of the low frequency oscillating signal fL to the frequency of the reference oscillating signal fref.

After being frequency divided, the divided low frequency oscillating signal fL' and the divided reference oscillating signal fref' are input to the frequency comparator 306, for comparing of the corresponding frequencies. When the frequency of the low frequency oscillating signal fL is larger than the frequency of the reference oscillating signal fref, the frequency comparison result generated by the frequency comparator 306 is 1. When the frequency of the low frequency oscillating signal fL equals to the frequency of the reference oscillating signal fref, the frequency comparison result generated by the frequency comparator 306 is 0. When the frequency of the low frequency oscillating signal fL is lower than the frequency of the reference oscillating signal fref, the frequency comparison result generated by the frequency comparator 306 is −1. The frequency comparison result generated by the frequency comparator 306 is further input to the accumulator 308 so that the accumulator 308 may fine tune the signal at the sum output terminal 310 as the frequency control value and store the frequency control value in the register 204 of the clock generator 200.

An embodiment of the accumulator 308 is further disclosed in FIG. 3. As shown in FIG. 3, two input terminals of the accumulator 308 respectively receive signals from the sum output terminal 310 of the accumulator 308 and the frequency comparison result from the frequency comparator 306. The reference oscillating signal fref is further coupled to the control terminal of the accumulator 308 via the divider 304 as the control clock of the accumulator 308.

Figure 4:
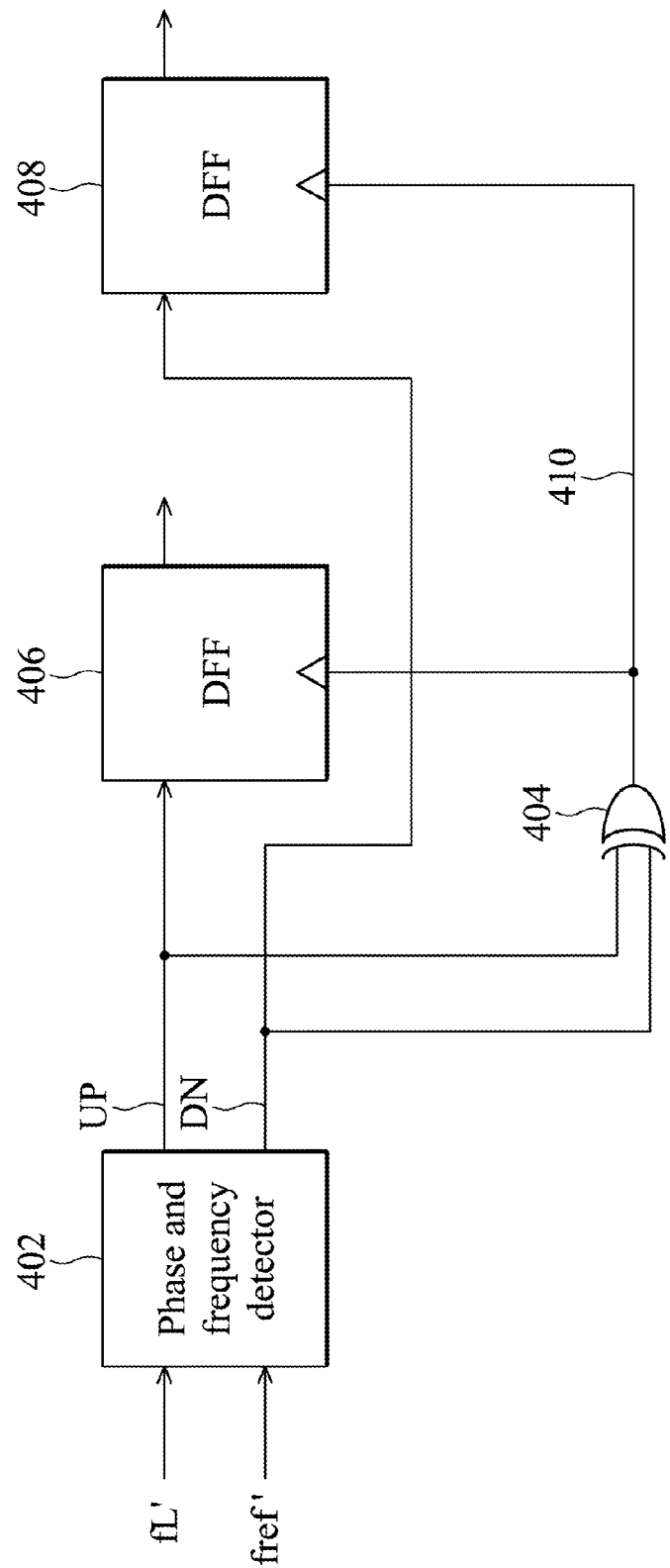
FIG. 4 is an implementation of a frequency comparator according to an embodiment of the invention.

FIG. 4 is an implementation of the frequency comparator 306 shown in FIG. 3 according to an embodiment of the invention. The frequency comparator comprises a phase and frequency detector 402, an exclusive or (XOR) gate 404 and two D flip-flop (DFF) 406 and 408. The divided low frequency oscillating signal fL' and the divided reference oscillating signal fref' are respectively derived from the low frequency oscillating signal fL and the reference oscillating signal fref, and received by the phase and frequency detector 402. When the frequency of the low frequency oscillating signal fL is larger than the frequency of the reference oscillating signal fref, an up signal UP of the phase and frequency detector 402 is enabled. When the frequency of the low frequency oscillating signal fL is lower than the frequency of the reference oscillating signal fref, a down signal DN of the phase and frequency detector 402 is enabled. The XOR gate 404 generates a DFF control signal 410 according to the up signal UP and the down signal DN. The first DFF 406 receives the up signal UP and operates according to the DFF control signal 410 so as to provide the frequency comparison result 1 when the frequency of the low frequency oscillating signal fL is larger than the frequency of the reference oscillating signal fref. The second DFF 408 receives the down signal DN and operates according to the DFF control signal 410 so as to provide the frequency comparison result −1 when the frequency of the low frequency oscillating signal fL is lower than the frequency of the reference oscillating signal fref. When the frequency of the low frequency oscillating signal fL equals to the frequency of the reference oscillating signal fref, both of the DFFs 406 and 408 provide the frequency comparison result 0. At this time, the fine tune process of the frequency control value of the frequency adjustment circuit 300 shown in FIG. 3 converges and an optimum frequency control value of the adjustment procedure is obtained. Note that in other embodiments, other types of flip-flops, such as the T flip-flop, may also be utilized to achieve the same result and the invention should not be limited to use the above-mentioned DFF.

Figure 5:
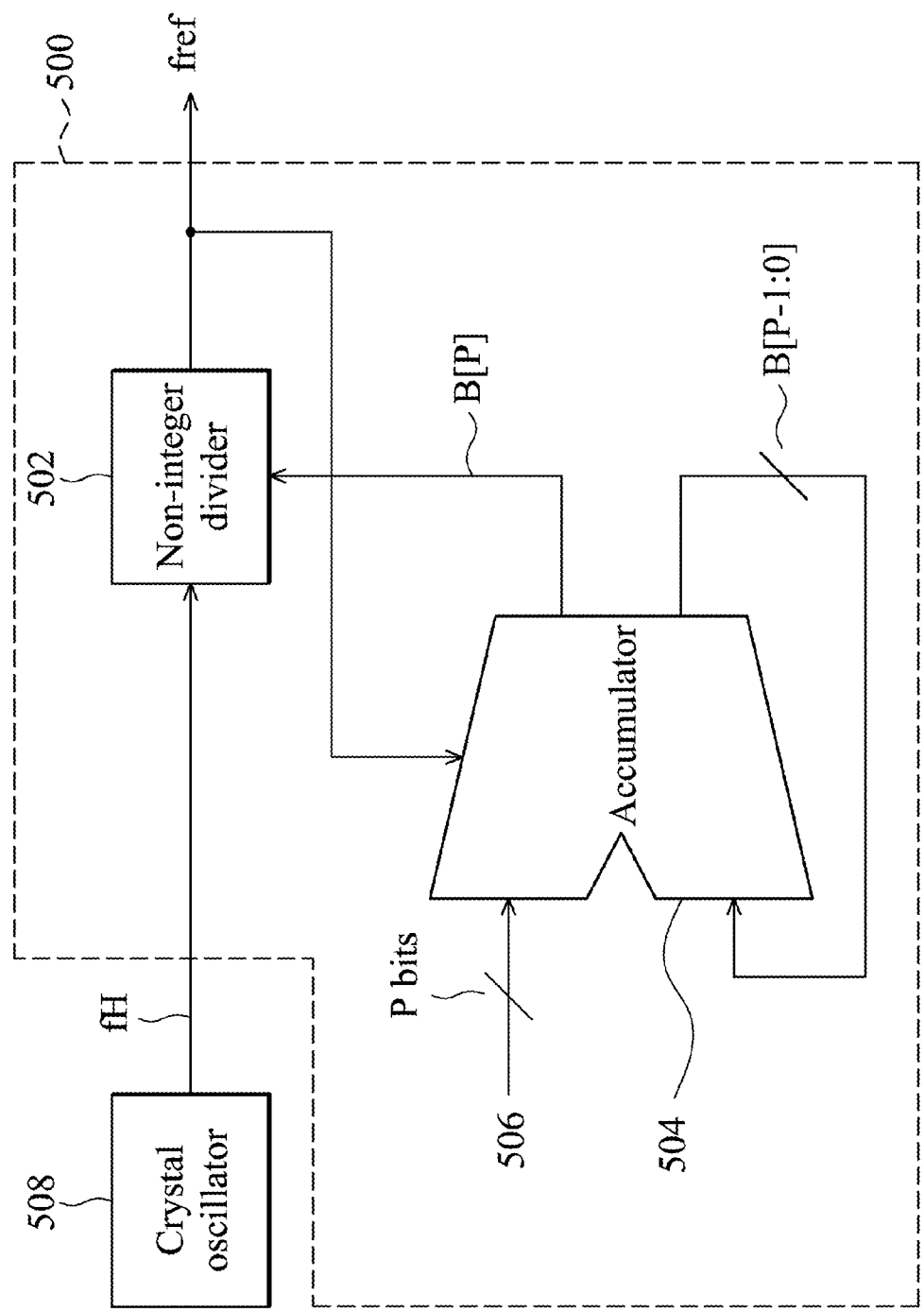
FIG. 5 shows a reference oscillating signal generator according to an embodiment of the invention.

A reference oscillating signal generator generating the reference oscillating signal fref received by the frequency adjustment circuit 300 is further proposed. FIG. 5 shows a reference oscillating signal generator according to an embodiment of the invention. The reference oscillating signal generator 500 comprises a non-integer divider 502 and an accumulator 504. The non-integer divider 502 receives a high frequency oscillating signal fH and dynamically divides a frequency of the high frequency oscillating signal fH by a plurality of integer numbers according to the overflow output signal B[P] of the accumulator 504, to generate the above-mentioned reference oscillating signal fref. As shown in the figure, the accumulator 504 is a P bits accumulator accumulating a frequency division control value 506 so as to generate an accumulation result B[P−1:0] and an overflow output B[P]. The accumulator 504 receives the reference oscillating signal fref as a control clock. When the value of the overflow output B[P] is a logic 0, the non-integer divider 502 divides a frequency of the high frequency oscillating signal fH by a first integer (for example, integer K). When the value of the overflow output B[P] is a logic 1, the non-integer divider 502 divides the frequency of the high frequency oscillating signal fH by a second integer (for example, integer (K+1)). Therefore, the frequency of the reference oscillating signal fref is a non-integer division result of that of the high frequency oscillating signal fH.

Figure 6:
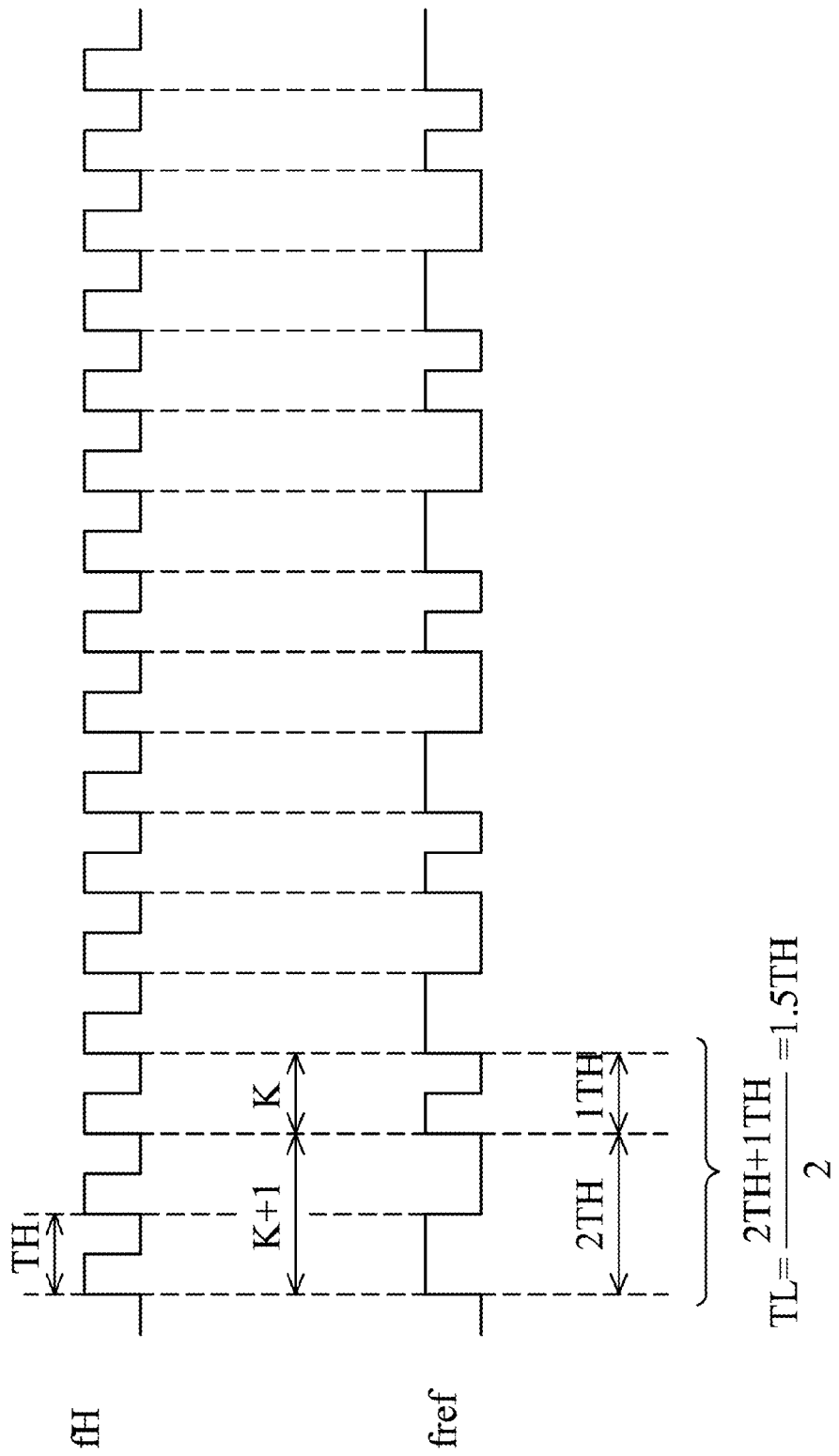
FIG. 6 shows the signal waveforms for illustrating the operation of the non-integer divider.

FIG. 6 shows the signal waveforms for illustrating the operation of the non-integer divider 502. For illustrative simplicity, the integer value K is assumed to be 1. Therefore, the above-mentioned first integer and second integer are respectively 1 and 2. As shown in the figure, the oscillation period of the high frequency oscillating signal fH is TH, and the value of the overflow output B[P] is switched between a logic 1 and a logic 0. When the value of the overflow output B[P] is a logic 1, the frequency of the high frequency oscillating signal fH is divided by 2. Therefore, the oscillation period of the obtained reference oscillating signal fref is 2TH. When the value of the overflow output B[P] is a logic 0, the frequency of the high frequency oscillating signal is divided by 1. Therefore, the oscillation period of the obtained reference oscillating signal fref becomes 1TH. The waveform of the reference oscillating signal fref as shown in FIG. 6 is obtained by repeatedly dividing the frequency of the high frequency oscillating signal fH by 2 and 1. Therefore, the average oscillation period of the reference oscillating signal fref is 1.5TH (because (2TH+1TH)/2=1.5TH). In other words, the reference oscillating signal fref is generated by dividing the frequency of the high frequency oscillating signal fH by a non-integer value 1.5.

The high frequency oscillating signal fH received by the reference oscillating signal generator 500 may be provided by a crystal oscillator 508. Take the CDMA communication system as an example, the crystal oscillator 508 is designed to generate the high frequency oscillating signal fH oscillating at 19.2 MHz. In the embodiment of the invention, the accumulator 504 may be a 4 bits (P=4) accumulator, and the frequency division control value 506 may be set to a binary value '1111'. When the value of the overflow output B[P] is a logic 1, the non-integer divider 502 divides the frequency of the high frequency oscillating signal fH by 586, and when the value of the overflow output B[P] is a logic 0, the non-integer divider 502 divides the frequency of the high frequency oscillating signal fH by 585. In this manner, the resulting frequency of the reference oscillating signal fref in the long term is oscillated accurately at 32.768 KHz, and the generated reference oscillating signal fref is input to the frequency adjustment circuit 300.

Figure 7:
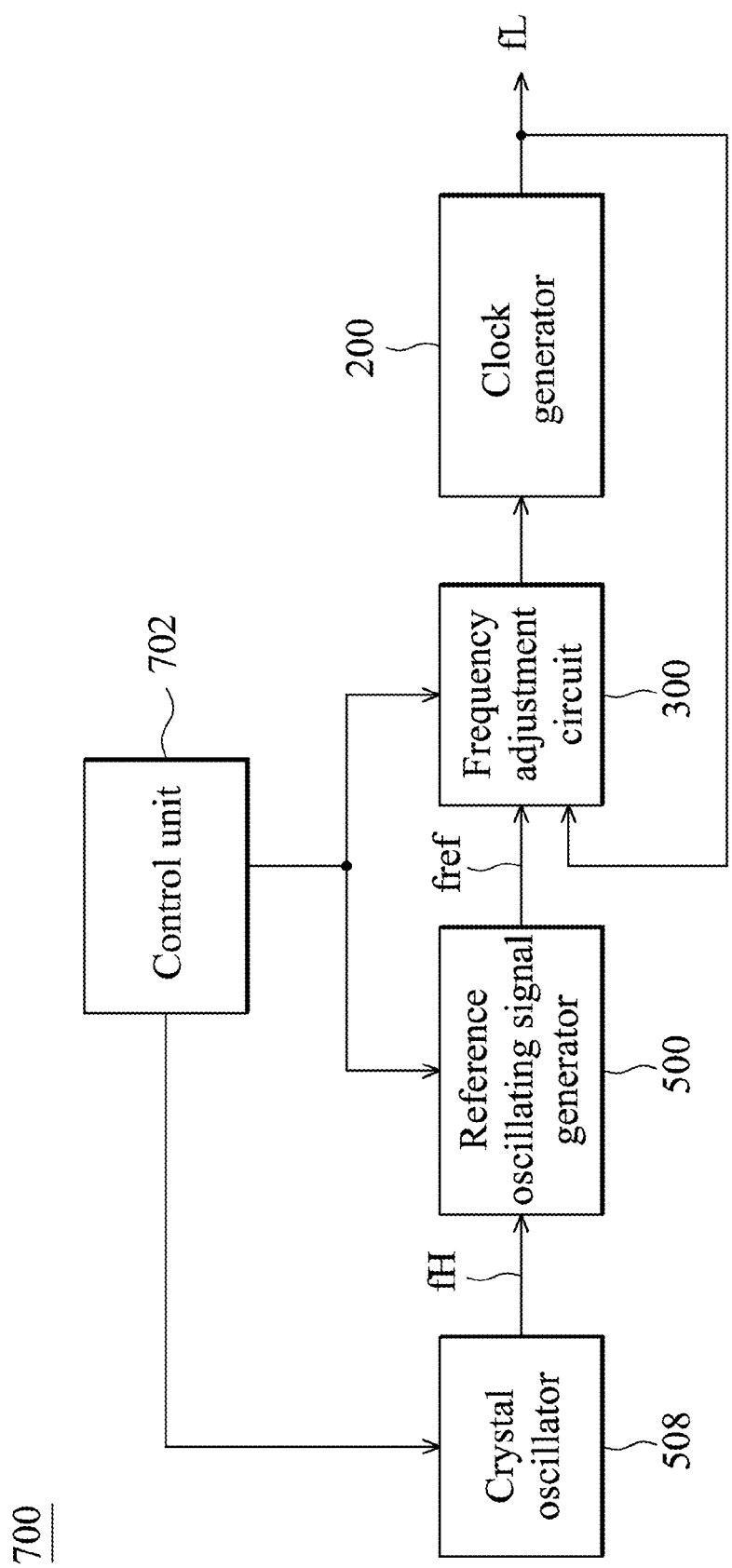
FIG. 7 is a block diagram showing the applications in a mobile communication device according to an embodiment of the invention.

The circuit diagrams described above may be integrated in a mobile communication device. FIG. 7 is a block diagram showing the applications in a mobile communication device according to an embodiment of the invention. In the embodiment, the mobile communication device 700 comprises a control unit 702, a crystal oscillator 508 and a reference oscillating signal generator 500 as shown in FIG. 5, a frequency adjustment circuit 300 as shown in FIG. 3 and a clock generator 200 as shown in FIG. 2. Note that the crystal oscillator 508, the reference oscillating signal generator 500 and the frequency adjustment circuit 300 do not have to be activated all the time, and the corresponding statuses can be controlled by the control unit 702.

The mobile communication device 700 may operate in a communication mode and a low power consumption mode. In the communication mode, the control unit 702 activates the crystal oscillator 508 so as to provide the high frequency oscillating signal fH for establishing communications. In addition, during the period when the crystal oscillator 508 is activated, the control unit 702 may further activate the reference oscillating signal generator 500 and the frequency adjustment circuit 300 so as to set the frequency control value in the register 204 of the clock generator 200. In the low power consumption mode, the control unit 702 deactivates the crystal oscillator 508, the reference oscillating signal generator 500 and the frequency adjustment circuit 300 for power saving. However, in the low power consumption mode, the clock signal provided as the real time clock may still be continuously generated by the clock generator 200 according to the frequency control value stored in the register 204. The oscillating signal generating circuit 206 (which may be the oscillating signal generating circuit 100 as shown in FIG. 1) in the clock generator 200 may be utilized to generate the oscillating signal. Therefore, no crystal oscillator is further required. For the mobile communication device 700 shown in FIG. 7, an accurate low frequency oscillating signal (fL) is generated and provided as the real time clock signal without using a dedicated crystal oscillator. Therefore, the proposed communication device can not only save battery power, but also reduce production costs.

Note that the above-mentioned oscillating signal generating circuit 206 is not limited to be implemented by using the current/capacitor oscillating technique as shown in FIG. 1. Any oscillating device different from a crystal oscillator, such as a current/capacitor oscillator (I/C oscillator), a resistor-capacitor oscillator (RC oscillator), or other oscillating circuit, may be utilized in the oscillating signal generating circuit 206 by making a slight modification to adjust the oscillating frequency of the output signal according to an one-bit control signal (as the control signal CS shown in FIG. 1). In some embodiments of the invention, the oscillating signal generating circuit 206 may be integrated inside of the chip to achieve the propose of providing the oscillating signal in a low cost way.

In addition, the above-mentioned techniques are not limited to be implemented by only hardware devices. Some techniques may also be carried out by firmware.

Figure 8:
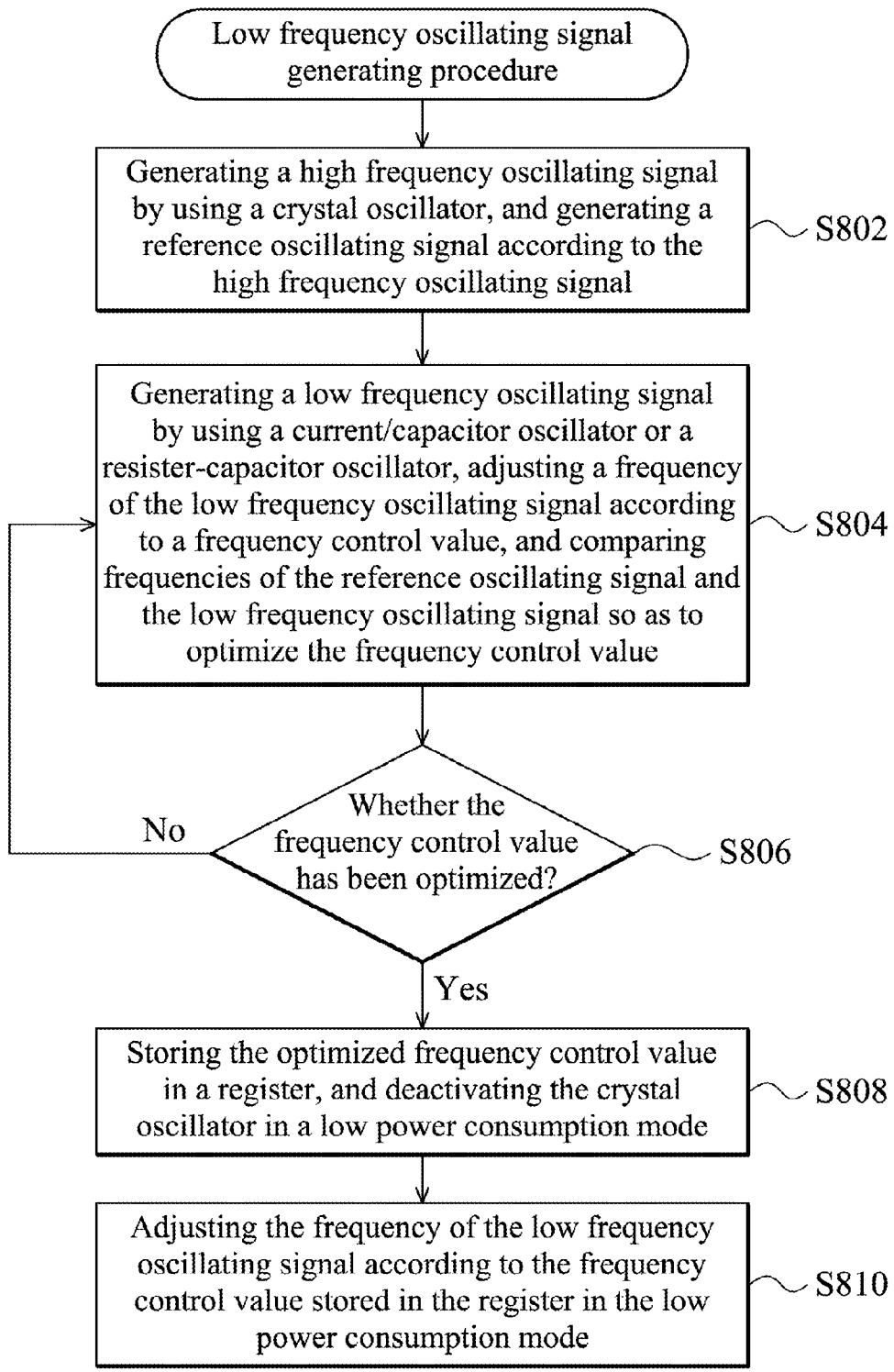
FIG. 8 is a flow chart showing a low frequency oscillating signal generating procedure according to an embodiment of the invention.

FIG. 8 is a flow chart showing a low frequency oscillating signal generating procedure according to an embodiment of the invention. As shown in step S802, a high frequency oscillating signal fH is generated by using a crystal oscillator 508, and a reference oscillating signal fref is generated according to the high frequency oscillating signal fH. In step S804, a low frequency oscillating signal fL is generated by using a current/capacitor oscillator or a resister-capacitor oscillator, a frequency of the low frequency oscillating signal fL is adjusted according to a frequency control value, and frequencies of the reference oscillating signal fref and the low frequency oscillating signal fL are compared so as to optimize the frequency control value. In step S806, it is determined whether the frequency control value has been optimized. When it is determined that the frequency control value has not yet been optimized, the process returns to step S804 to dynamically change the frequency control value so as to adjust the frequency of the low frequency oscillating signal. On the other hand, when it is determined that the frequency control value has been optimized in step S806, the process proceeds to step S808. In step S808, the optimized frequency control value is stored in a register, and the crystal oscillator is deactivated in a low power consumption mode so as to reduce the power consumed by continuous operation of the crystal oscillator. In step S810, in the low power consumption mode, the frequency of the low frequency oscillating signal is adjusted according to the frequency control value stored in the register so as to optimize the frequency of the low frequency oscillating signal.

The method shown in FIG. 8 has solved the common frequency offset problem of the oscillating signal generated by the current/capacitor oscillator or the resistor-capacitor oscillator. The proposed low frequency oscillating signal generating method may further be applied in any type of electronic device.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A clock generator, comprising:
a first accumulator, comprising a first input terminal, a second input terminal, a first control terminal, a first sum output terminal and a first overflow output terminal, wherein the second input terminal is coupled to the first sum output terminal;
an oscillating signal generating circuit, generating a first oscillating signal and adjusting a frequency of the first oscillating signal according to a first overflow output signal of the first overflow output terminal of the first accumulator, wherein the oscillating signal generating circuit comprises at least one current source, and the frequency of the first oscillating signal is adjusted by increasing or decreasing at least one current provided by the at least one current source according to the first overflow output signal; and
a frequency adjustment circuit, generating a frequency control value according to the first oscillating signal and a reference oscillating signal, and comprising:
a frequency comparator, comparing frequencies of the first oscillating signal and the reference oscillating signal, and generating a frequency comparison result; and
a second accumulator, comprising a third input terminal, a fourth input terminal, a second control terminal and a second sum output terminal, wherein the fourth input terminal is coupled to the second sum output terminal, the frequency comparison result is received at the third input terminal, the second control terminal is coupled to the reference oscillating signal so that the second accumulator accordingly accumulates the frequency comparison result, and provides the frequency control value at the second sum output terminal,
wherein the frequency control value is received at the first input terminal of the first accumulator, and the first oscillating signal is received at the first control terminal so that the first accumulator accordingly accumulates the frequency control value to generate the first overflow output signal.

2. The clock generator as claimed in claim 1, wherein
when the frequency of the first oscillating signal is larger than the frequency of the reference oscillating signal, the frequency comparison result generated by the frequency comparator is 1;
when the frequency of the first oscillating signal equals to the frequency of the reference oscillating signal, the frequency comparison result generated by the frequency comparator is 0; and
when the frequency of the first oscillating signal is less than the frequency of the reference oscillating signal, the frequency comparison result generated by the frequency comparator is −1.

3. The clock generator as claimed in claim 1, wherein the frequency adjustment circuit further comprises:
a first divider, coupled to the oscillating signal generating circuit and the frequency comparator for dividing the frequency of the first oscillating signal by $2^M$ and providing the divided first oscillating signal to the frequency comparator; and
a second divider, for dividing the frequency of the reference oscillating signal by $2^M$ and providing the divided reference oscillating signal to the frequency comparator and the second control terminal of the second accumulator, where M is an integer larger than a bit number of the first accumulator.

4. The clock generator as claimed in claim 1, further comprising a reference oscillating signal generator comprising:
a third accumulator, comprising a fifth input terminal, a sixth input terminal, a third control terminal, a third sum output terminal and a second overflow output terminal, wherein the sixth input terminal is coupled to the third sum output terminal, a frequency division control value is received at the fifth input terminal, the reference oscillating signal is received at the third control terminal so that the third accumulator accordingly accumulates the frequency division control value and generates a second overflow output signal at the second overflow output terminal; and
a non-integer divider, receiving a second oscillating signal and dividing a frequency of the second oscillating signal by a plurality of integer numbers according to the second overflow output signal of the third accumulator so as to generate the reference oscillating signal, wherein the frequency of the second oscillating signal is larger than the frequency of the first oscillating signal.

5. The clock generator as claimed in claim 4, wherein the second oscillating signal is provided by a crystal oscillator.

6. The clock generator as claimed in claim 5, further comprising a register registering the frequency control value.

7. The clock generator as claimed in claim 6, wherein when the clock generator is in a low power consumption mode, the crystal oscillator, the frequency adjustment circuit and the reference oscillating signal generator are disabled, and the first accumulator accumulates the frequency control value registered in the register to generate the first overflow output signal.

8. The clock generator as claimed in claim 1, wherein the oscillating signal generating circuit comprises:
a first current source, providing a first current;
a second current source, providing a second current;
a capacitor, coupled to the first current source and the second current source and charging or discharging via the first current source or the second current source to generate the first oscillating signal; and
a logic operation unit, generating a first signal and a second signal according to the first overflow output signal, wherein the first current and the second current are increased or decreased in response to the first signal and the second signal so as to increase or decrease a charging or discharging speed of the capacitor.

9. A mobile communication device, comprising:
a crystal oscillator, providing a high frequency oscillating signal;
a clock generator, providing a low frequency oscillating signal, comprising:
a first accumulator, comprising a first input terminal, a second input terminal, a first control terminal, a first sum output terminal and a first overflow output terminal, wherein the second input terminal is coupled to the first sum output terminal;
an oscillating signal generating circuit, generating the low frequency oscillating signal and adjusting a frequency of the low frequency oscillating signal according to a first overflow output signal of the first overflow output terminal of the first accumulator, wherein the oscillating signal generating circuit comprises at least one current source, and the frequency of the low frequency oscillating signal is adjusted by increasing or decreasing at least one current provided by the at least one current source according to the first overflow output signal; and
a frequency adjustment circuit, generating a frequency control value according to the low frequency oscillating signal and a reference oscillating signal, and comprising:
a frequency comparator, comparing frequencies of the first oscillating signal and the reference oscillating signal, and generating a frequency comparison result; and
a second accumulator, comprising a third input terminal, a fourth input terminal, a second control terminal and a second sum output terminal, wherein the fourth input terminal is coupled to the second sum output terminal, the frequency comparison result is received at the third input terminal, the second control terminal is coupled to the reference oscillating signal so that the second accumulator accordingly accumulates the frequency comparison result, and provides the frequency control value at the second sum output terminal,
wherein the frequency control value is received at the first input terminal of the first accumulator, and the low frequency oscillating signal is received at the first control terminal so that the first accumulator accordingly accumulates the frequency control value to generate the first overflow output signal; and
a reference oscillating signal generator, generating the reference oscillating signal according to the high frequency oscillating signal provided by the crystal oscillator.

10. The mobile communication device as claimed in claim 9, further comprising:
a register for registering the frequency control value,
wherein when the mobile communications device is in a low power consumption mode, the crystal oscillator, the frequency adjustment circuit and the reference oscillating signal generator are disabled, and the first accumulator accumulates the frequency control value registered in the register to generate the first overflow output signal.

11. A clock generating method, comprising:
generating a first oscillating signal by an oscillating signal generator;
generating a frequency control value according to the first oscillating signal and a reference oscillating signal by comparing frequencies of the first oscillating signal and the reference oscillating signal to generate a frequency comparison result and accumulating the frequency comparison result of the first oscillating signal and the reference oscillating signal to obtain the frequency control value;

accumulating the frequency control value according to the first oscillating signal to generate a first overflow indicator; and adjusting a frequency of the first oscillating signal according to the first overflow indicator, wherein the frequency of the first oscillating signal is adjusted by increasing or decreasing at least one current provided by at least one current source of the oscillating signal generator according to the first overflow indicator.

12. The clock generating method as claimed in claim 11, wherein:

when the frequency of the first oscillating signal is larger than the frequency of the reference oscillating signal, the frequency comparison result is 1;

when the frequency of the first oscillating signal equals to the frequency of the reference oscillating signal, the frequency comparison result is 0; and when the frequency of the first oscillating signal is less than the frequency of the reference oscillating signal, the frequency comparison result is −1.

13. The clock generating method as claimed in claim 11, further comprising:

dividing frequencies of the first oscillating signal and the reference oscillating signal by $2^M$ before comparing frequencies of the first oscillating signal and the reference oscillating signal, wherein M is an integer larger than a bit number of a first accumulator, and the first accumulator performs the step of accumulating the frequency control value.

14. The clock generating method as claimed in claim 11, further comprising:

accumulating a frequency division control value according to the reference oscillating signal to generate a second overflow indicator; and dividing a frequency of a second oscillating signal generated by a crystal oscillator by a plurality of integer numbers according to the second overflow indicator so as to generate the reference oscillating signal, wherein the frequency of the second oscillating signal is larger than the frequency of the first oscillating signal.

15. The clock generating method as claimed in claim 14, further comprising:

providing a register registering the frequency control value, and accumulating the frequency control value registered in the register to generate the first overflow indicator when the crystal oscillator is disabled.

* * * * *